United States Patent [19]
Chung et al.

[11] Patent Number: 5,530,653
[45] Date of Patent: Jun. 25, 1996

[54] METHOD OF AUTOMATICALLY DETECTING AND SETTING STACK TYPE NETWORK SYSTEM TERMINATING RESISTANCE, AND APPARATUS THEREFOR

[75] Inventors: Cheng-Chien Chung; Henry P. Ngai; Fwu-Tsair Chang, all of Hsin Chu, Taiwan

[73] Assignee: D-Link Corporation, Hsin Chu, Taiwan

[21] Appl. No.: 494,533

[22] Filed: Jun. 26, 1995

[51] Int. Cl.$^6$ .............................. G02B 27/00; G01R 27/00
[52] U.S. Cl. ................................................ 364/482; 250/551
[58] Field of Search ............................ 340/825; 250/551

[56] References Cited

U.S. PATENT DOCUMENTS 3,946,423  3/1976  Augustine ............................. 357/30
5,296,715  3/1994  Kronberg ............................. 250/551
5,461,370  10/1995 Igarashi et al. .................... 340/825.05

Primary Examiner—Emanuel T. Voeltz
Assistant Examiner—Demetra Smith
Attorney, Agent, or Firm—Bacon & Thomas

[57] ABSTRACT

The method of the invention is to install a respective photo coupler to the input port as well as the output port of each system terminal device and then to connect the system devices of the network system in series, so as to isolate the electric signal of one system device from another and to detect if the system terminal device is at the terminal end of the network system, and to connect the input port as well as the output port of each system terminal device to respective terminal resistance through a respective switch, permitting each switch to receive the control signal from the respective photo coupler so that the actual location of the system terminal device is shown and the necessary terminal resistance will be automatically installed when necessary.

7 Claims, 4 Drawing Sheets

| | A | B |
|---|---|---|
| 1 | ON | ON |
| 2 | OFF | ON |
| 3 | ON | OFF |
| 4 | OFF | OFF |

5,530,653

METHOD OF AUTOMATICALLY DETECTING AND SETTING STACK TYPE NETWORK SYSTEM TERMINATING RESISTANCE, AND APPARATUS THEREFOR

BACKGROUND OF THE INVENTION

The present invention relates to a method of detecting the actual location of the system terminal device of a stack type network system by means of the operation of photo couplers and current loops, and automatically installing a terminating resistance to the detected location when necessary. The invention relates also to apparatus for the application of such a method.

In designing a stack type network system, the installation of terminating resistance and the judgment of the location of the system terminal device will be encountered and must be settled. Currently, when in a long distance communication situation, the user shall have to find the terminal end of the cable so that a proper terminating resistance can be installed. If a network system is formed by arranging different systems in a stack, as shown in FIG. 1, a terminating resistance R1 is connected to the input port of the first device 1, the output port of the first device 1 is connected to the input port of a second device 2 by a signal line and a ground line, the output port of the second device 2 is connected to the input port of the third device 3 by a signal line and a ground line, and the output port of the third device 3 is connected to a terminating resistance R3. The terminal resistances R1 and R3 are matched subject to the impedance and characteristics of the system devices connected. When the system devices of the network system are changed, the respective terminal resistances must be relatively changed. For example, if the third system device 3 is taken away, the terminating resistance R3 shall be connected to the output port of the second system device 2. However, because the impedance and characteristics of the second system device 2 are different from that of the third system device 3, an error information or load tends to occur when the terminating resistance R3 is directly connected to the output port of the second system device 2. Besides, the procedure of finding the location of the terminal and replacing the terminating resistance is inconvenient.

Furthermore, in the design of a stack type network system, it may be necessary to detect the installation location of the system terminal device. According to regular methods, the signal lines and the ground lines are respectively connected in series, shown in FIG. 2. However, the system devices of the network system may be damaged because of ground potential differences when the signal lines and the ground lines are respectively connected in series.

SUMMARY OF THE INVENTION

The present invention has been accomplished under the circumstances in view. It is the main object of the present invention to provide a method of automatically detecting & setting stack type network system terminating resistance, which is to install a respective photo coupler to the input port as well as the output port of each system terminal device and then to connect the system devices of the network system in series, so as to isolate the electric signal of one system device from another and to detect if the system terminal device is at the terminal end of the network system. It is another object of the present invention to provide an apparatus for the application of the aforesaid method of automatically detecting & setting stack type network system terminating resistance, which is simple in design and practical in use.

BRIEF DESCRIPTION OF THE DRAWINGS

The present invention will now be described by way of examples with reference to the annexed drawings, in which.

DETAILED DESCRIPTION OF THE PREFERRED EMBODIMENT

Figure 1:
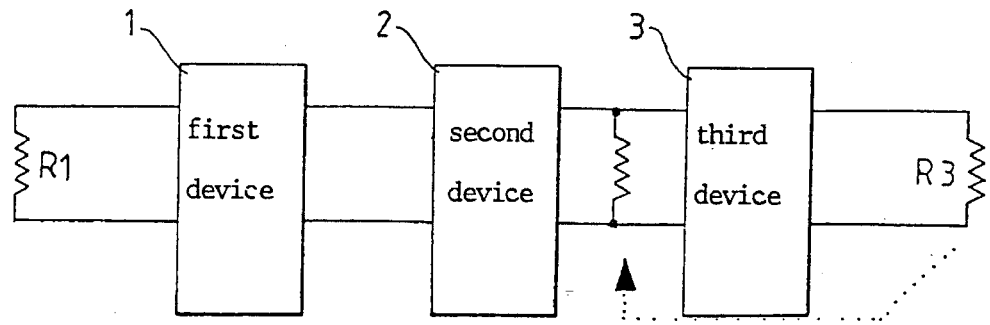
FIG. 1 is a schematic drawing showing terminating resistances connected to the system devices of a stack type network system according to the prior art.
Figure 2:
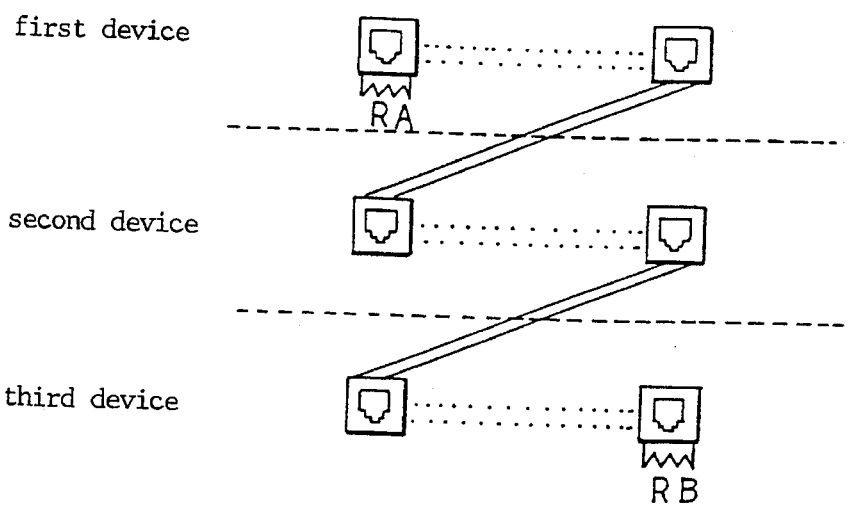
FIG. 2 is a schematic drawing showing the system devices of a conventional stack type network system connected in series by signal lines and ground lines.
Figure 3:
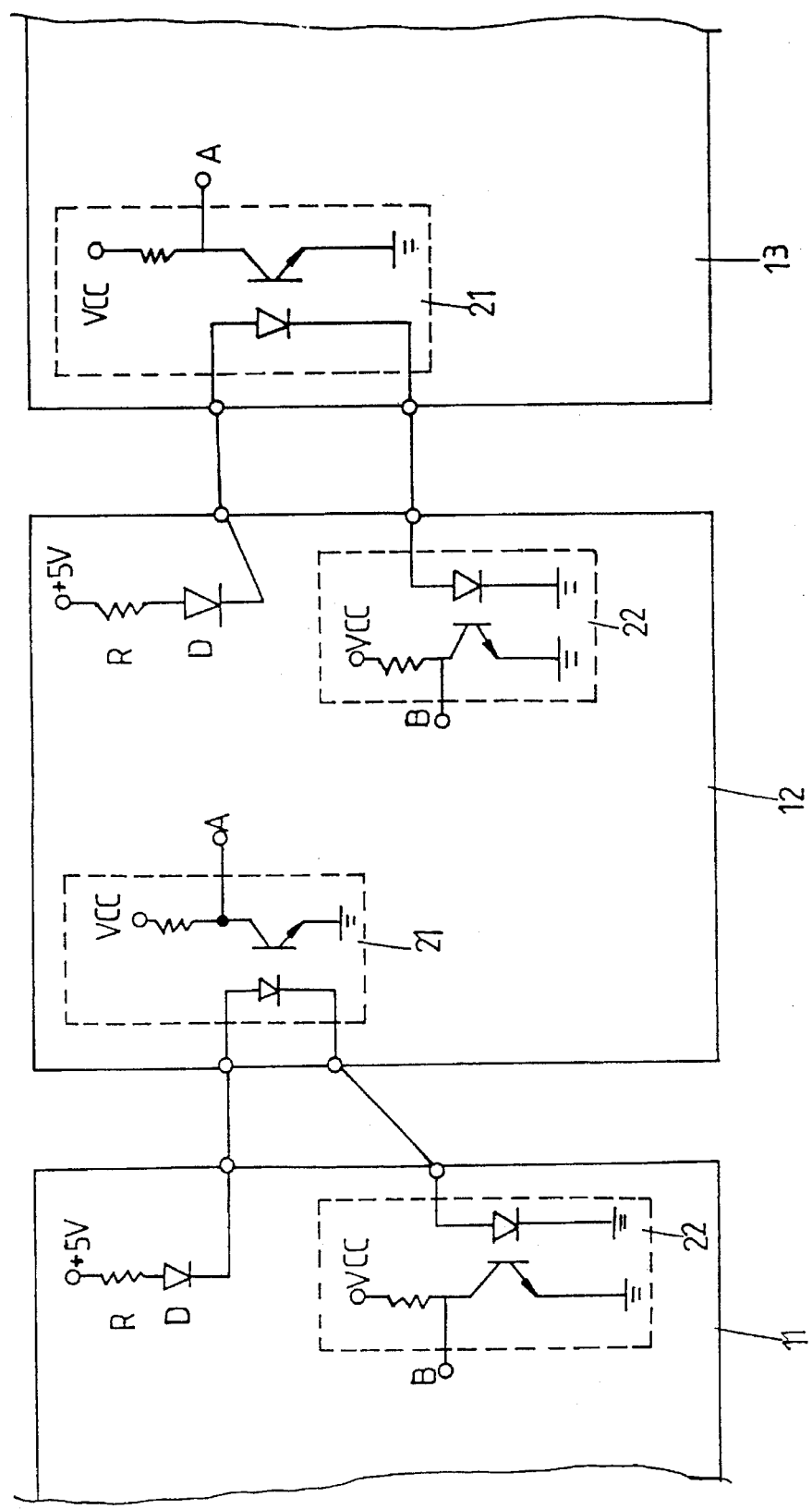
FIG. 3 is a circuit diagram showing the arrangement of the system terminal device detecting circuit according to the present invention.

Referring to FIG. 3, the present invention comprises a plurality of system devices 1, a plurality of first photo couplers 21, and a plurality of second photo couplers 22.

Referring to FIG. 3 again, the system devices 1 include (subject to the present preferred embodiment) a first system device 11, a second system device 12, and a third system device 13. The input terminals of the first system device 11, the second system device 12 and the third system device 13 are coupled with a respective first photo coupler 21. The first system device 11, the second system device 12 and the third system device 13 have a respective first output terminal coupled with a respective diode D, and a respective second output terminal coupled with a respective second photo coupler 22. Each diode D has one end, namely, the positive end connected with a current limit resistor R, and an opposite end of the current limit resistor R connected with +5 V power supply. The output terminals of the first system device 11 are connected to the input terminals of the second system device 12, and the output terminals of the second system device 12 are connected to the input terminals of the third system device 13 (if the stack type network system includes more than 3 system devices, they are connected in the same manner). Therefore, the first system device 11, the second system device 12, the third system device 13, etc., are connected with the first photo couplers 21 and the second photo couplers 22 into a current loop, which detects the actual location of the system terminal device. When the system devices are started, each system device sends an output signal through one output terminal, which output signal is sent to the first input terminal, first photo coupler 21, and second input terminal of the successive system device, and second photo coupler 22 of its own system device, forming a current loop, and at the same time a first control signal A and a second control signal B are respectively obtained from the output terminals of such photo couplers 21 and 22. These control signals A and B are to control a first switch SW1 and a second switch SW2 in the system device, and therefore terminating resistance can be automatically installed when necessary. The control modes are shown in FIGS. 4 and 5.

Figures 4, 5:
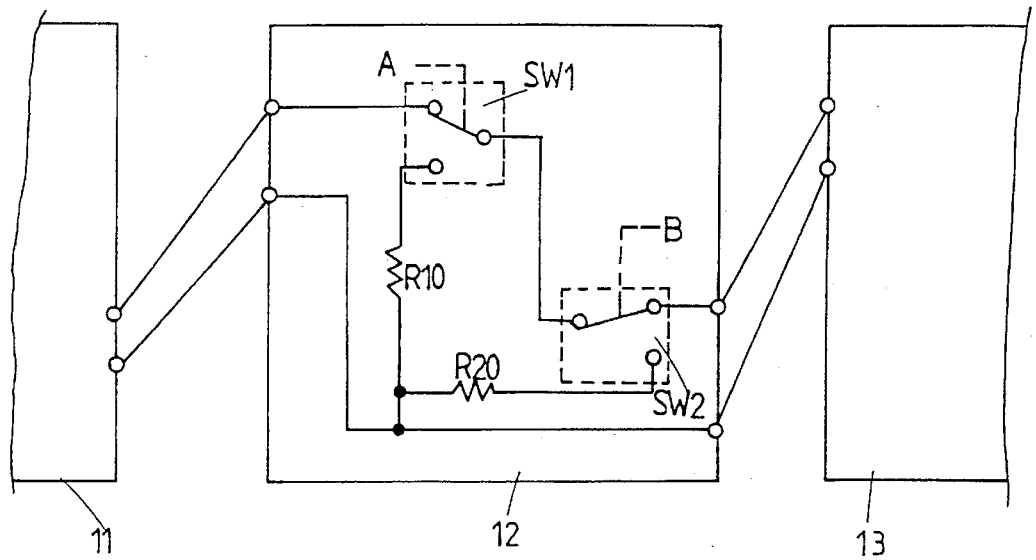
FIG. 4 is a circuit diagram showing the arrangement of the system terminating resistance setting circuit according to the present invention.
FIG. 5 is a system terminal detecting true value chart according to the present invention.

Referring to FIG. 4, the aforesaid SW1 and SW2 are installed in the system device, for example, the second system device 12. The first switch SW1 is connected to the first input terminal of the second system device 12. The second switch SW2 is connected to the first output terminal of the second system device 12. The normal open terminal of the first switch SW1 is connected to a first terminating resistance R10. The opposite end of the first terminating resistance R10 is connected to a second terminating resistance R20, and then connected to the second input terminal and second output terminal of the second system device 12. The second terminating resistance R20 has one end connected to the first terminating resistance R10 and an opposite end connected to the normal open terminal of the second switch SW2. The normal close terminal of the first switch SW1 is bridged to its common terminal, and then connected to the first input terminal of the system device 12. The common terminal of the first switch SW1 is connected to the common terminal of the second switch SW2. The common terminal of the second switch SW2 is bridged to its normal close terminal. The normal close terminal of the second switch SW2 is connected to the first output terminal of the system device Referring to FIG. 5 and FIG. 4 again, in a stack type network system having a plurality of system devices connected in series, when one system device (for example, the third system device 13) is taken away, the first switch SW1 of the preceding system device 12 is maintained in the normal close status (ON status), the second switch SW2 of the preceding system device 12 is switched to the normal open status (OFF status), and therefore the output terminals of the system device 12 are automatically connected in parallel by the second resistance R20 of the system device 12. When the first system device 11 is taken away, the first switch SW1 of the successive system device 12 is switched to normal open status (OFF status), the second switch SW2 of the successive system device 12 is maintained in the normal close status (ON status), and therefore the input terminals of the system device 12 are connected in parallel by the first resistance R10. Therefore, the switches SW1 and SW2 can be maintained in or switched to ON or OFF status to automatically detect the location of the system terminal device and to install a terminating resistance to the system terminal device.

Figure 6:
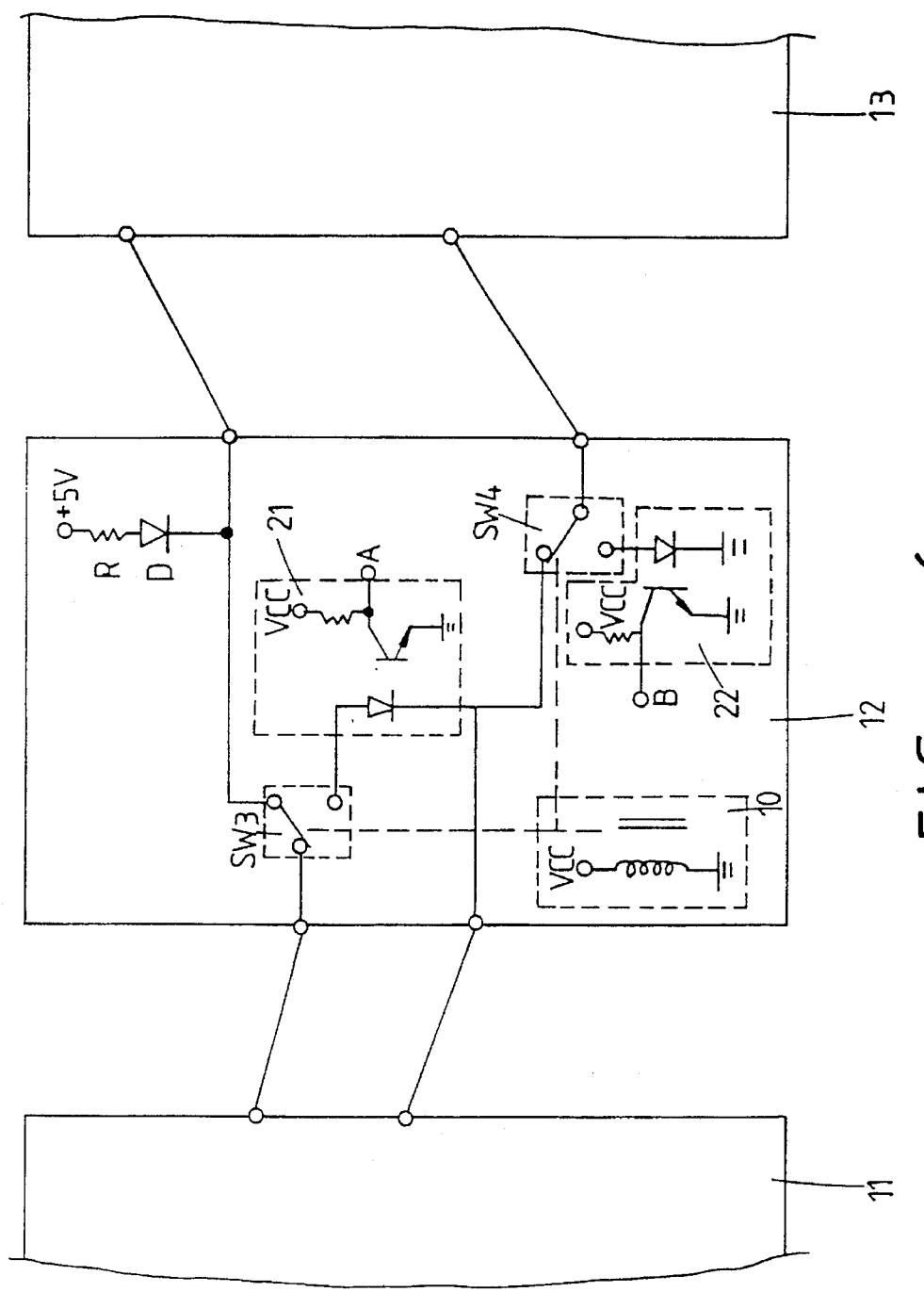
FIG. 6 is another circuit diagram according to the present invention, showing a third switch and a fourth switch installed in each system device.

In a network system, if one system device (for example, the second system device 12) is maintained started, the system becomes unable to automatically detect the actual location of the system terminal device, and the signal of the first system device 11 can not be transmitted to the third system device 13. In order to eliminate this problem, a third switch SW3 and a fourth switch SW4 are respectively connected in series to one input terminal of the first photo coupler 21 and one input terminal of the second photo coupler 22 (see FIG. 6). The common terminal of the third switch SW3 is bridged to its normal close terminal and then connected to the first input terminal of the system device. The normal close terminal of the third switch SW3 is connected to the first output terminal of the system device. The fourth switch SW4 is connected to one end of the second photo coupler 22. The common terminal and normal close terminal of the fourth switch SW4 are respectively connected to the opposite end of the first photo coupler 21 and the second output terminal of the system device. The third switch SW3 and the fourth switch SW4 are also connected to power supply 10, which controls the switches SW3 and SW4, causing them simultaneously maintained in the normal close or normal open status for controlling the signal transmitting passage of the system device, therefore any system device which is maintained in ON status can transmit the signal from the preceding system device to the successive system device, or turn on other system devices, so as to detect the actual location of the system terminal device.

It is to be understood that the drawings are designed for purposes of illustration only, and are not intended as a definition of the limits and scope of the invention disclosed.

We claim:

1. A stack type network system terminating resistance automatic detecting and setting apparatus comprising: at least two system devices, each system device having an input port, a first photo coupler connected to its input port, and an output port, the first photo coupler of one system device being connected to the output port of the preceding system device, one end of the output port of each system device being coupled with a diode, the diode of one system device being connected to one end of the input port of the successive system device, the positive terminal of the diode of each system device being connected to power supply through a current limit resistor, the opposite end of the output port of each system device being coupled with a second photo coupler, the second photo coupler of one system device being connected to the opposite end of the input port of the successive system device, wherein when said system devices are turned on, at least one current loop is formed between two adjacent system devices to isolate the electric signal of one system device from another so as to detect if the system terminal device is at the terminal end of the network system.

2. The stack type network system terminating resistance automatic detecting and setting apparatus of claim 1 wherein the output ends of the first photo coupler and second photo coupler of each system device are respectively connected to a respective first switch and a respective second switch, the normal open terminal of said first switch being connected to a first terminating resistance, which has an opposite end connected to a second terminating resistance and then connected to one end of the input port of the same system device and one end of the output port thereof, said second terminating resistance having one end connected to said first terminating resistance and an opposite end of said second switch, the normal open terminal of said second switch being connected to said first terminating resistance, the normal close terminal of said first switch being bridged to its common terminal and then connected to one end of the input port of the same system device, the common terminal of said first switch being connected to the common terminal of said second switch, the common terminal of said second switch being bridged to its normal close terminal, the normal close terminal of said second switch being connected to an opposite end of the output port of the same system device.

3. The stack type network system terminating resistance automatic detecting and setting apparatus of claim 1 wherein the first photo coupler of each system device has one end connected to a respective third switch, the common terminal and normal close terminal of said third switch being respectively connected to one end of the input port of the same system device and one end of the output port thereof; the second photo coupler of each system device has one end connected to a respective fourth switch, the common terminal and normal close terminal of said fourth switch being respectively connected to the opposite end of the first photo coupler of the same system device and the opposite end of the output port of the same system device; the third switch and the fourth switch are connected to power supply, which controls said third and fourth switches, causing them simultaneously maintained in the normal close or normal open status for controlling the signal transmitting passage of the respective system device, so that when any system device of the network system which is maintained in ON status can transmit signal, or detect the actual location of any system device of the network system.

4. A method of automatically detecting & setting stack type network system terminating resistance, comprising the steps of connecting the system devices of a network system in series; causing one system device to provide a drive signal from one end of its output port, permitting the drive signal to be sent through one end of the input port of the successive system device to the first photo coupler of the successive system device, and then sent to the second photo coupler of the successive system device and simultaneously fedback to the current system device through the opposite end of the input port of the successive system device, so as to form a current loop and to obtain a first control signal from the output end of the first photo coupler of the successive system device and a second control signal from the output end of the second photo coupler of the successive system device; and using said first control signal and said second control signal to control the first switch and second switch of the same system device respectively, so as to automatically detect the actual location of the system terminal device of the network system.

5. The method of automatically detecting & setting stack type network system terminating resistance according to claim 4, wherein when one system device is taken away, the first switch SW1 of the preceding system device is maintained in the normal close status (ON status), the second switch of the preceding system device is switched to the normal open status (OFF status), and therefore the output port of the preceding system device is automatically connected with the second resistance of the same system device.

6. The method of automatically detecting & setting stack type network system terminating resistance according to claim 4, wherein when one system device is taken away, the first switch SW1 of the successive system is switched to normal open status (OFF status), the second switch of the successive system device is maintained in the normal close status (ON status), and therefore the output terminal of the successive system device is connected with the first resistance of the same system device so that the the location of the system terminal device of the network system is detected.

7. The method of automatically detecting & setting stack type network system terminating resistance according to claim 4, wherein when one system device is maintained started, the third switch and fourth switch of the same system device are simultaneously maintained in the normal close status (ON status) for permitting the signal from the preceding system device to the transmitted to the successive system device, or simultaneously maintained in the normal open status (OFF status) showing the location of the system terminal device of the network system.

* * * * *